(12) United States Patent
Kelkar et al.

(10) Patent No.: US 9,966,464 B2
(45) Date of Patent: May 8, 2018

(54) METHOD OF FORMING A SEMICONDUCTOR STRUCTURE HAVING INTEGRATED SNUBBER RESISTANCE

(71) Applicant: Infineon Technologies Americas Corp., El Segundo, CA (US)

(72) Inventors: Kapil Kelkar, Torrance, CA (US); Timothy D. Henson, Mount Shasta, CA (US); Ling Ma, Redondo Beach, CA (US); Mary Bigglestone, Newport (GB); Adam Amali, Chandler, AZ (US); Hugo Burke, Llantrisant (GB); Robert Haase, San Pedro, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days. days.

(21) Appl. No.: 15/457,436

(22) Filed: Mar. 13, 2017

(65) Prior Publication Data

US 2017/0186861 A1    Jun. 29, 2017

Related U.S. Application Data

(62) Division of application No. 14/870,394, filed on Sep. 30, 2015, now Pat. No. 9,627,328.
(Continued)

(51) Int. Cl.
    *H01L 29/70*    (2006.01)
    *H01L 29/78*    (2006.01)
    (Continued)

(52) U.S. Cl.
    CPC ...... *H01L 29/7803* (2013.01); *H01L 23/5226* (2013.01); *H01L 23/552* (2013.01);
    (Continued)

(58) Field of Classification Search
    CPC . H01L 29/7803; H01L 29/405; H01L 29/407; H01L 29/0869; H01L 29/0865;
    (Continued)

(56) References Cited

U.S. PATENT DOCUMENTS

| 5,233,215 A | 8/1993 | Baliga |
| 5,554,862 A | 9/1996 | Omura et al. |

(Continued)

OTHER PUBLICATIONS

Roig, J. et al., "Suitable Operation Conditions for Different 100V Trench-Based Power MOSFETs in 48V-input Synchronous Buck Converters", Proceedings of the 2011—14th European Conference on Power Electronics and Applications (EPE 2011), Aug. 30-Sep. 1, 2011, Sep. 15, 2011, pp. 1-9.

*Primary Examiner* — Roy Potter
(74) *Attorney, Agent, or Firm* — Murphy, Bilak & Homiller, PLLC

(57) ABSTRACT

A semiconductor structure is disclosed. The semiconductor structure includes a source trench in a drift region, the source trench having a source trench dielectric liner and a source trench conductive filler surrounded by the source trench dielectric liner, a source region in a body region over the drift region. The semiconductor structure also includes a patterned source trench dielectric cap forming an insulated portion and an exposed portion of the source trench conductive filler, and a source contact layer coupling the source region to the exposed portion of the source trench conductive filler, the insulated portion of the source trench conductive filler increasing resistance between the source contact layer and the source trench conductive filler under the patterned source trench dielectric cap. The source trench is a serpentine source trench having a plurality of parallel portions connected by a plurality of curved portions.

19 Claims, 8 Drawing Sheets

Related U.S. Application Data

(60) Provisional application No. 62/061,785, filed on Oct. 9, 2014.

(51) Int. Cl.
*H01L 29/40* (2006.01)
*H01L 29/08* (2006.01)
*H01L 29/66* (2006.01)
*H01L 23/522* (2006.01)
*H01L 23/552* (2006.01)
*H01L 29/06* (2006.01)

(52) U.S. Cl.
CPC ...... *H01L 29/0696* (2013.01); *H01L 29/0865* (2013.01); *H01L 29/0869* (2013.01); *H01L 29/405* (2013.01); *H01L 29/407* (2013.01); *H01L 29/66734* (2013.01); *H01L 29/7811* (2013.01); *H01L 29/7813* (2013.01)

(58) Field of Classification Search
CPC ............. H01L 29/7811; H01L 29/7813; H01L 29/66734; H01L 23/5226; H01L 23/552; H01L 29/0696
See application file for complete search history.

(56) References Cited

U.S. PATENT DOCUMENTS

| | | |
|---|---|---|
| 5,895,951 A | 4/1999 | So et al. |
| 6,031,265 A | 2/2000 | Hshieh |
| 6,049,108 A | 4/2000 | Williams et al. |
| 7,504,306 B2 | 3/2009 | Sapp et al. |
| 8,643,071 B2 | 2/2014 | Pan et al. |
| 8,680,611 B2 | 3/2014 | Kocon et al. |
| 8,829,624 B2 | 9/2014 | Gladish et al. |
| 9,123,802 B2 | 9/2015 | Mathur et al. |
| 9,287,371 B2 | 3/2016 | Moens et al. |
| 9,318,598 B2 | 4/2016 | Grebs et al. |
| 9,368,587 B2 | 6/2016 | Kocon et al. |
| 2012/0156845 A1 | 6/2012 | Kocon et al. |
| 2012/0280312 A1 | 11/2012 | Pan |
| 2015/0325641 A1 | 11/2015 | Hirler et al. |
| 2016/0104766 A1 | 4/2016 | Kelkar et al. |

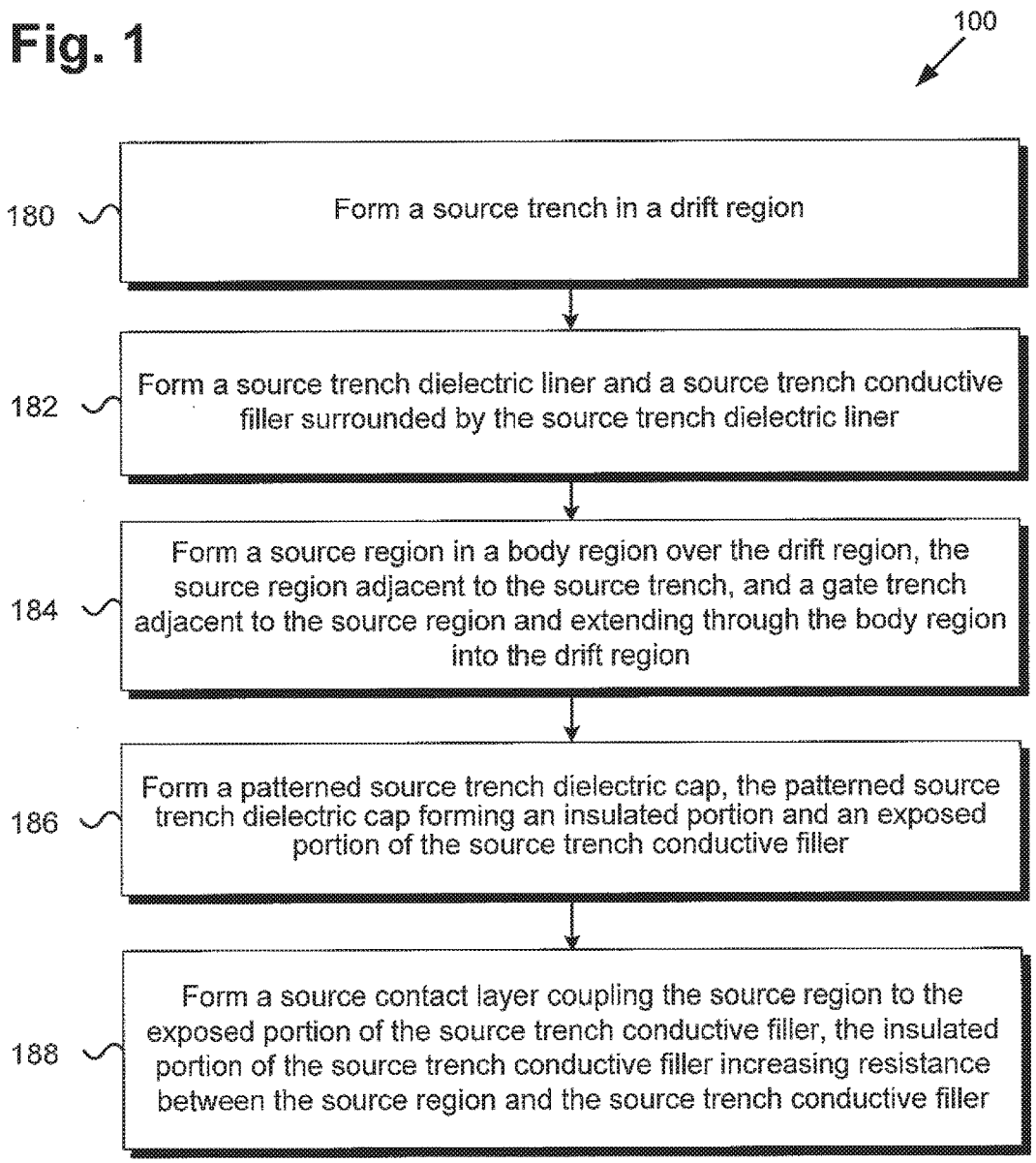

METHOD OF FORMING A SEMICONDUCTOR STRUCTURE HAVING INTEGRATED SNUBBER RESISTANCE

The present application claims the benefit of and priority to U.S. non-provisional patent application Ser. No. 14/870.394 filed Sep. 30. 2005, which in turn claims the benefit of and priority to a provisional patent application entitled "Optimized Rsnubber Resistance," Ser. No. 62/061, 785 filed on Oct. 9, 2014. The disclosure in this non-provisional patent application and this provisional application are hereby incorporated fully by reference into the present application.

BACKGROUND

RC snubbers are frequently used in the electrical systems where inductive elements are present. For example, a sudden flow of current through an inductive element can create an excessive spike in voltage that could be detrimental to electrical components in a circuit. The RC snubbers can provide a safer current path to protect the electrical components. Also, when designed properly, the RC snubbers can reduce the electromagnetic interference (EMI) by controlling (e.g., damping) oscillations in the circuit.

In a conventional trench type semiconductor device, an drain-to-source capacitance along with other parasitic capacitances and inductances can create undesirable output oscillations. In the conventional trench type semiconductor device, RC snubbers are provided on a semiconductor die outside of the active region to achieve a required level of damping. The RC snubbers in the conventional trench type semiconductor device not only take up limited die space but also need additional processing steps and masks.

Thus, there is a need to overcome the drawbacks and deficiencies in the art by providing a trench type semiconductor structure with one or more integrated RC snubbers without sacrificing the limited die space and without additional processing steps and cost.

SUMMARY

The present disclosure is directed to a semiconductor structure having an integrated snubber resistance and related method, substantially as shown in and/or described in connection with at least one of the figures, and as set forth in the claims.

BRIEF DESCRIPTION OF THE DRAWINGS

FIG. 1 is a flowchart illustrating a method of forming a semiconductor structure according to one implementation of the present application.

DETAILED DESCRIPTION

Figure 2A:
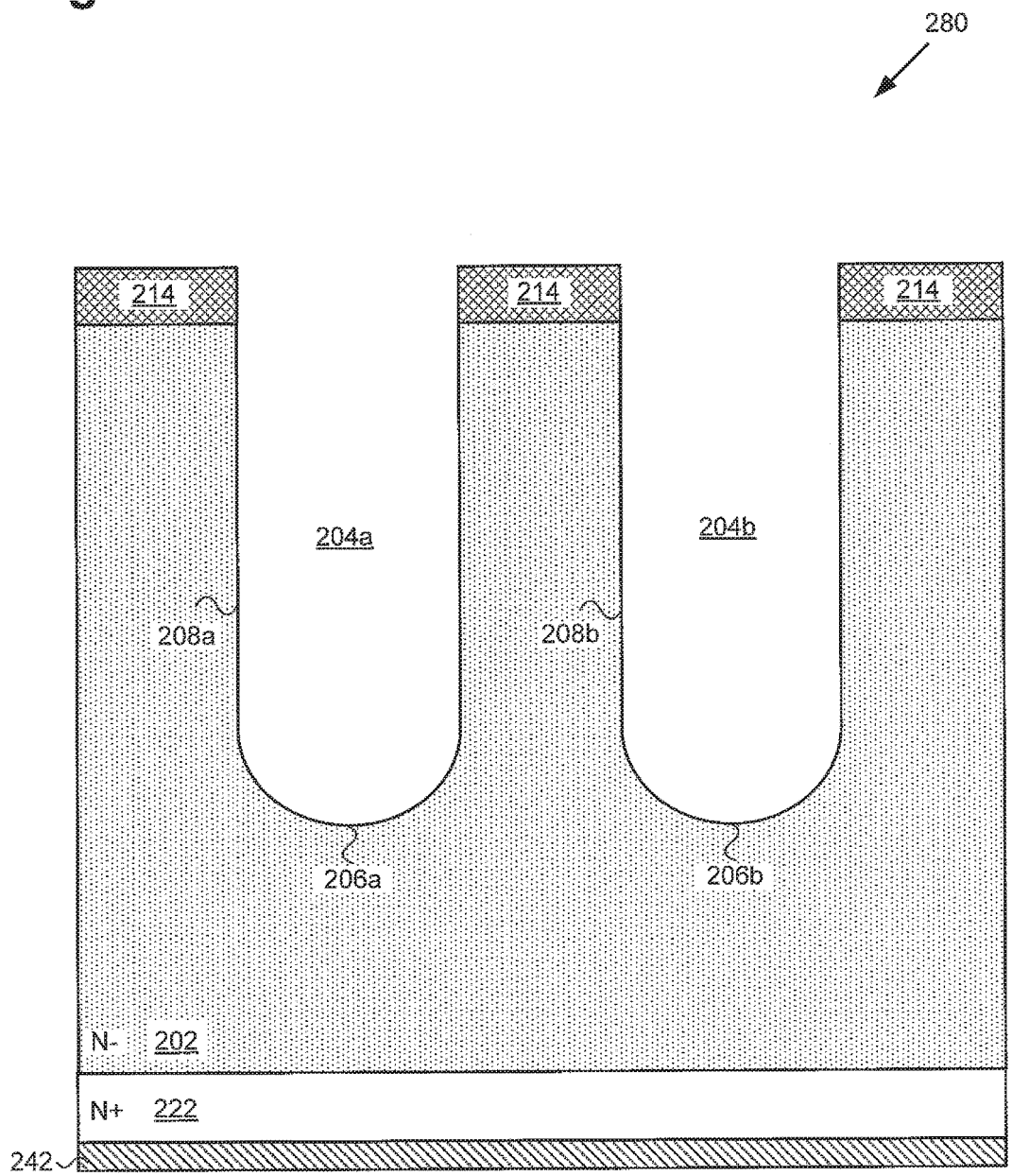
FIG. 2A illustrates a cross-sectional view of a portion of a semiconductor structure processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming an exemplary semiconductor device according to an implementation of the present application. Certain details and features have been left out of the flowchart that are apparent to a person of ordinary skill in the art. For example, an action may consist of one or more subactions or may involve specialized equipment or materials, as known in the art. Actions 180, 182, 184, 186 and 188 indicated in the flowchart are sufficient to describe one implementation of the present inventive concepts, other implementations of the present inventive concepts may utilize actions different from those shown in the flowchart. Moreover, semiconductor structures 280, 282, 284, 286 and 288 in FIGS. 2A, 2B, 2C, 2D and 2E illustrate the results of performing actions 180, 182, 184, 186 and 188 of flowchart 100, respectively. For example, semiconductor structure 280 is an exemplary structure of a portion of a power semiconductor device after processing action 180, semiconductor structure 282 is an exemplary structure of a portion of a power semiconductor device after the processing of action 182, semiconductor structure 284 is an exemplary structure of a portion of a power semiconductor device after the processing of action 184, and so forth.

Referring to action 180 in FIG. 1 and semiconductor structure 280 in FIG. 2A, action 180 includes forming a source trench in a drift region. Referring to FIG. 2A, semiconductor structure 280 illustrates a cross-sectional view of a portion of a semiconductor structure after completion of action 180 in flowchart 100 of FIG. 1, according to one implementation of the present disclosure. As illustrated in FIG. 2A, semiconductor structure 280 includes source trenches 204a and 204b, drift region 202, drain region 222 and drain contact layer 242. Source trenches 204a and 204b are formed in drift region 202. Drift region 202 is formed over drain region 222.

In the present implementation, drain region 222 includes a highly doped semiconductor (e.g., silicon) substrate as a drain of a semiconductor device, such as a metal oxide semiconductor field effect transistors (MOSFET). Drain region 222 is of a first conductivity type and is shown as having N+ conductivity by way of example. In the present implementation, drain region 222 may include an N type dopant, such as Phosphorus or Arsenic. In another implementation, drain region 222 may include a P type dopant, such as Boron. Drain contact layer 242 is formed at the bottom of drain region 222. Drift region 202 may include any semiconductor material, such as silicon, that can be epitaxially grown (e.g., epitaxial layer) on drift region 202. For example, drift region 202 may include epitaxial silicon grown on drain region 222. Drift region 202 is of the first conductivity type, and is shown as having N conductivity by way of example. In one implementation, drift region 202 can be intrinsically or pre-doped to be an N type material, or can be subsequently doped to become an N type material, for example. In the present implementation, drift region 202 may include an N type dopant, such as Phosphorus or Arsenic. In another implementation, drift region 202 may include a P type dopant, such as Boron.

As illustrated in FIG. 2A, in the present implementation, source trenches 204a and 204b are formed in drift region 202. Source trenches 204a and 204b may be formed by etching drift region 202 using patterned photoresist layer 214, for example. In the present implementation, source trenches 204a and 204b may be parallel portions of a continuous source trench (e.g., similar to serpentine source trench 404 in FIG. 4), where source trenches 204a and 204b are connected by a curved portion (not explicitly shown in FIG. 2A) of the continuous source trench. In another implementation, source trenches 204a and 204b may be two separate source trenches. In yet another implementation, source trench 204a may be a serpentine trench, and source trench 204b may be a termination trench enclosing source trench 204a.

As illustrated in FIG. 2A, source trenches 204a and 204b extend into drift region 202. Source trench 204a includes substantially parallel sidewalls 208a extending into bottom 206a. Source trench 204b includes substantially parallel sidewalls 208b extending into bottom 206b. In the present implementation, source trenches 204a and 204b each include a U-shaped bottom. In another implementation, source trenches 204a and 204b may each include sloped sidewalls and/or a flat bottom.

Figure 2B:
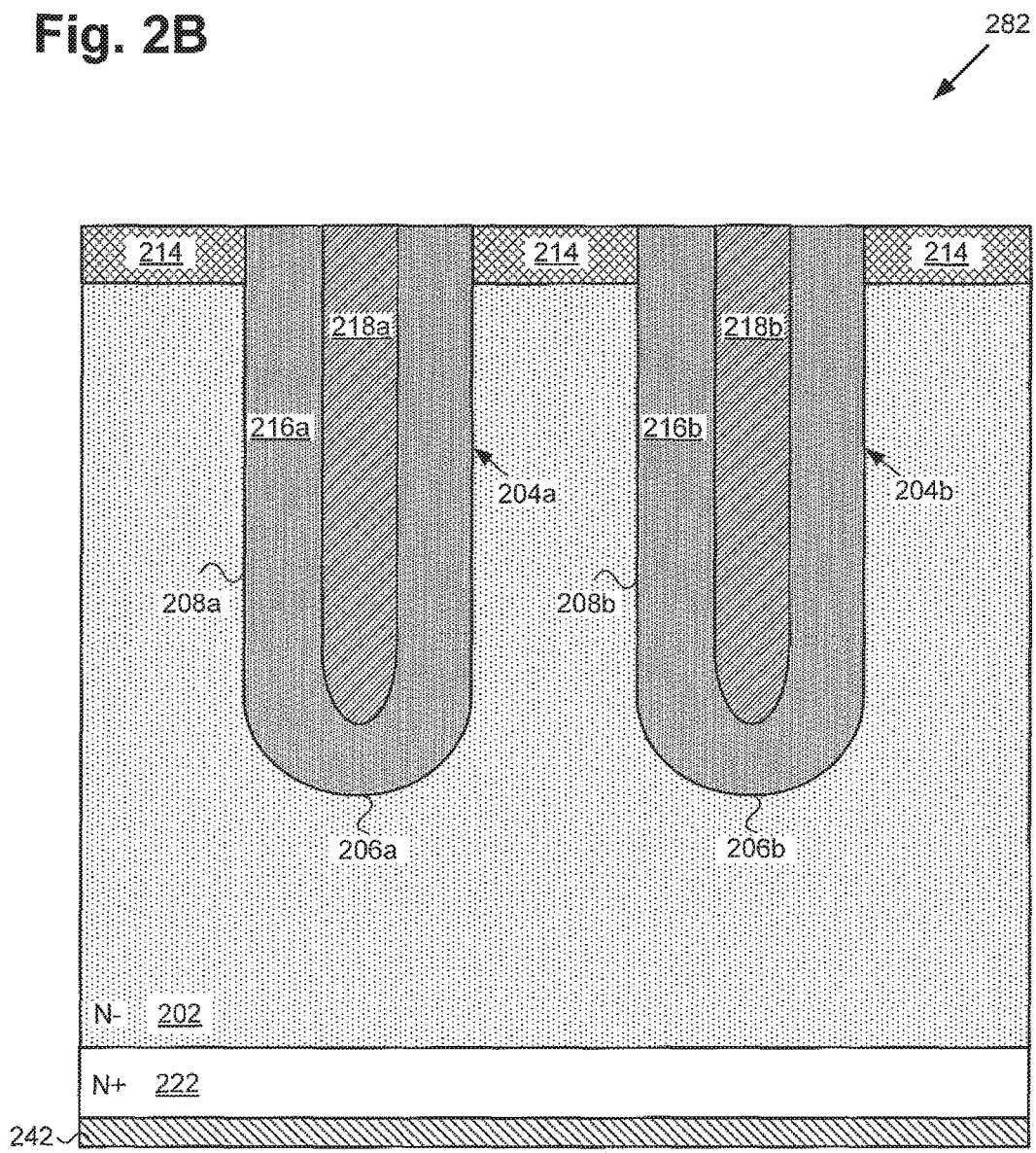
FIG. 2B illustrates a cross-sectional view of a portion of a semiconductor structure processed in accordance with an intermediate action in the flowchart of FIG. 1 according to one implementation of the present application.

Referring to action 182 in FIG. 1 and semiconductor structure 282 in FIG. 2B, action 182 includes forming a source trench dielectric liner and a source trench conductive filler surrounded by the source trench dielectric liner. Referring to FIG. 2B, semiconductor structure 282 illustrates a cross-sectional view of a portion of a semiconductor structure after completion of action 182 in flowchart 100 of FIG. 1, according to one implementation of the present disclosure. As illustrated in FIG. 2B, semiconductor structure 282 includes source trench dielectric liner 216a lining sidewalls 208a and bottom 206a of source trench 204a, and source trench dielectric liner 216b lining sidewalls 208b and bottom 206b of source trench 204b. For example, source trench dielectric liners 216a and 216b may be formed by depositing and/or thermally growing a dielectric material in source trenches 204a and 204b, respectively. In the present implementation, source trench dielectric liners 216a and 216b include silicon oxide. In another implementation, source trench dielectric liners 216a and 216b may include other suitable dielectric material, such as silicon nitride or tetraethylorthosilicate ("TEOS") oxide.

As illustrated in FIG. 2B, source trench conductive fillers 218a and 218b are formed in source trenches 204a and 204b, respectively. Source trench conductive filler 218a is surrounded by source trench dielectric liner 216a in source trench 204a. Source trench conductive filler 218b is surrounded by source trench dielectric liner 216b in source trench 204b. In the present implementation, source trench conductive fillers 218a and 218b may include polysilicon or amorphous silicon. For example, N type doped polysilicon or N type doped amorphous silicon may be used as source trench conductive fillers 218a and 218b to fill in source trenches 204a and 204b, respectively. In some implementations, it may be preferred to use polysilicon or amorphous silicon as conductive fillers, because the doping concentration can be well controlled such that source trench conductive fillers 218a and 218b can each have a substantially uniform doping concentration in source trenches 204a and 204b, respectively. In other implementations, metallic material, such as tungsten and tungsten silicide, can be used as source trench conductive fillers 218a and 218b.

Figure 2C:
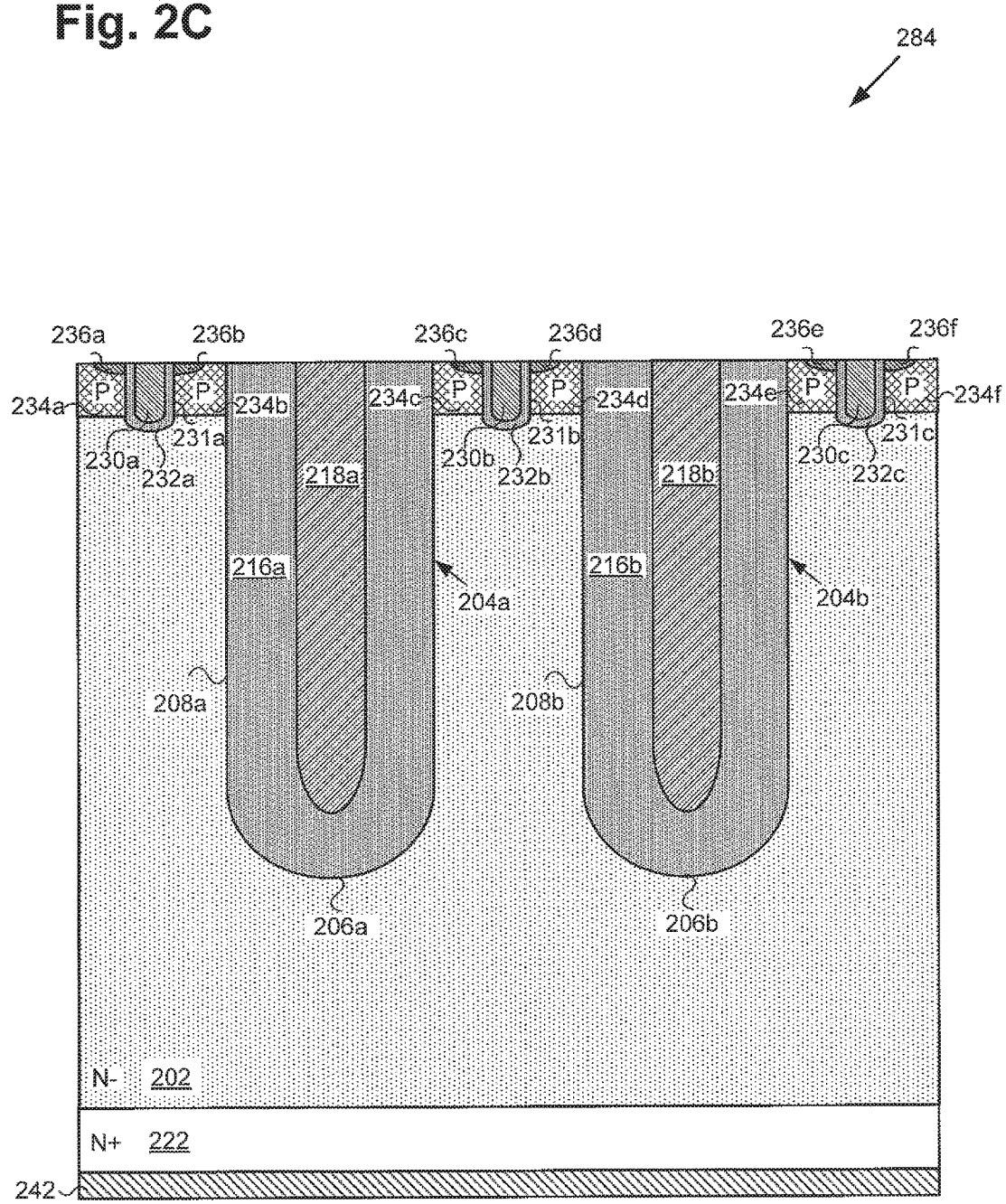
FIG. 2C illustrates a cross-sectional view of a portion of a semiconductor structure processed in accordance with an intermediate action in the flowchart of FIG. 1 according to one implementation of the present application.

Referring to action 184 in FIG. 1 and semiconductor structure 284 in FIG. 2C, action 184 includes forming a source region in a body region over the drift region, the source region adjacent to the source trench, and a gate trench adjacent to the source region and extending through the body region into the drift region. Referring to FIG. 2C, semiconductor structure 284 illustrates a cross-sectional view of a portion of a semiconductor structure after completion of action 184 in flowchart 100 of FIG. 1, according to one implementation of the present disclosure. As shown in FIG. 2C, semiconductor structure 284 includes body regions 234a, 234b, 234c, 234d, 234e and 234f (collectively referred to as body region 234) of a second conductivity type (e.g., P type) over drift region 202, gate trenches 231a, 231b and 231c having gate trench conductive fillers 230a, 230b and 230c respectively surrounded by gate dielectric liners 232a, 232b and 232c and extending through body region 234 into drift region 202, source regions 236a, 236b, 236c, 236d, 236e and 236f (collectively referred to as source regions 236) of the first conductivity type (e.g., N+ type), and drain region 222 of the first conductivity type (e.g., N+ type). In other implementations, drift region 202, drain region 222 and source regions 236a, 236b, 236c, 236d, 236e and 236f can be of P conductivity type, and body regions 234a, 234b, 234c, 234d, 234e and 234f can be of N conductivity type.

Figure 2D:
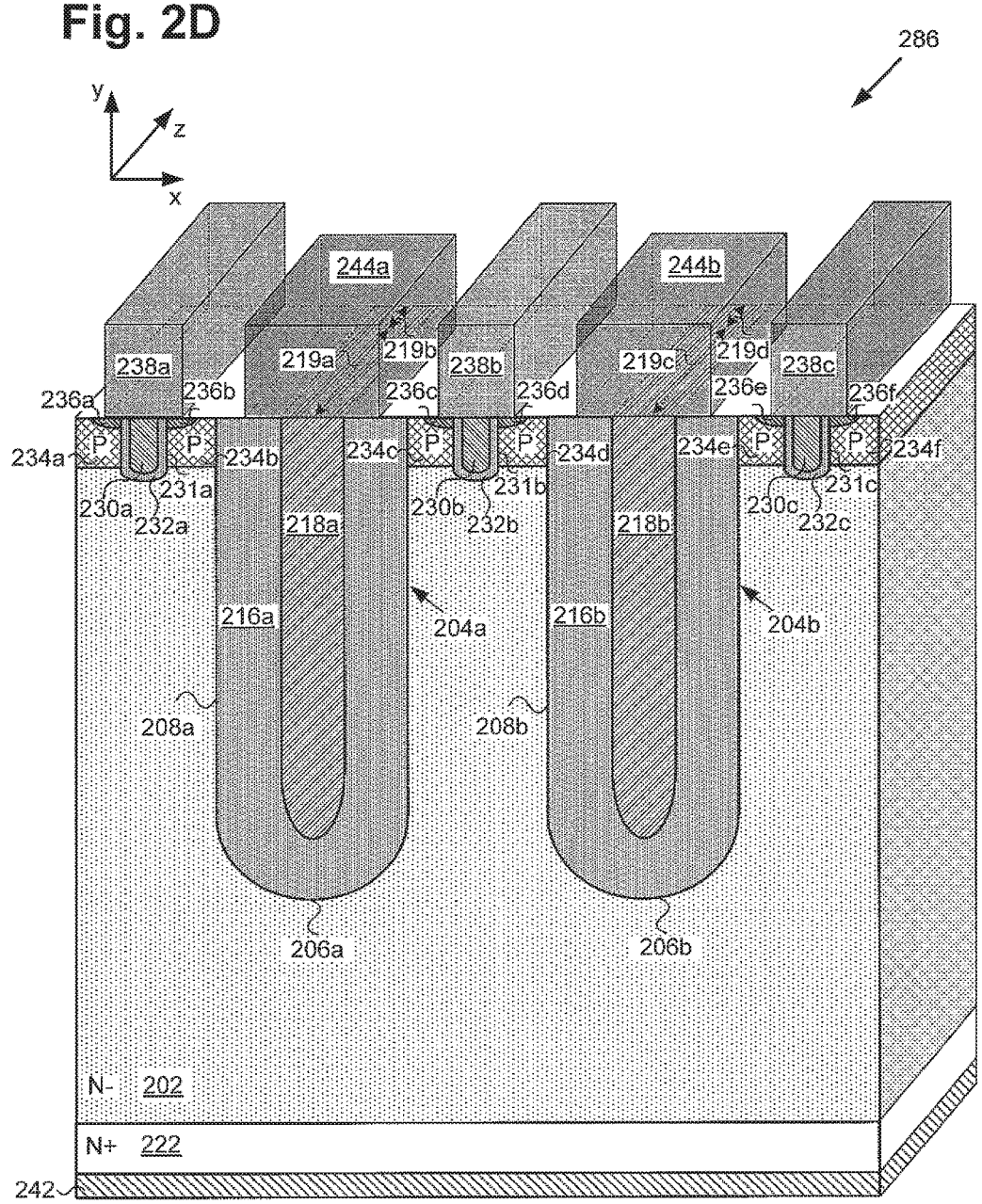
FIG. 2D illustrates a perspective cross-sectional view of a portion of a semiconductor structure processed in accordance with an intermediate action in the flowchart of FIG. 1 according to one implementation of the present application.

Referring to action 186 in FIG. 1 and semiconductor structure 286 in FIG. 2D, action 186 includes forming a patterned source trench dielectric cap, the patterned source trench dielectric cap forming an insulated portion and an exposed portion of the source trench conductive filler. Referring to FIG. 2D, semiconductor structure 286 illustrates a perspective cross-sectional view of a portion of a semiconductor structure after completion of action 186 in flowchart 100 of FIG. 1, according to one implementation of the present disclosure. As illustrated in FIG. 2D, semiconductor structure 286 includes patterned source trench dielectric caps 244a and 244b over portions of source trench conductive fillers 218a and 218b, respectively. Semiconductor structure 286 also includes gate trench dielectric caps 238a, 238b and 238c over gate trenches 231a, 231b and 231c, respectively. Unlike gate trench dielectric caps 238a, 238b and 238c that cover the entire length of respective gate trench conductive fillers 230a, 230b and 230c along the z-direction, patterned source trench dielectric caps 244a and 244b each cover a portion of respective source trench conductive fillers 218a and 218b along the z-direction. For example, patterned source trench dielectric cap 244a is formed over insulated portion 219a of source trench conductive filler 218a, leaving exposed portion 219b of source trench conductive filler 218a exposed for making electrical and mechanical connection with a subsequently formed source contact layer. Similarly, patterned source trench dielectric cap 244b is formed over insulated portion 219c of source trench conductive filler 218b, leaving exposed portion 219d of source trench conductive filler 218b exposed for making electrical and mechanical connection with the subsequently formed source contact layer.

In the present implementation, patterned source trench dielectric caps 244a and 244b and gate trench dielectric caps 238a, 238b and 238c may be formed concurrently, for example, by forming one or more dielectric layers (e.g., silicon dioxide) over semiconductor structure 284 in FIG. 2C, forming and patterning a photoresist layer (not explicitly shown in FIG. 2D) over the one or more dielectric layers, and removing the portions of the one or more dielectric layers not covered by the photoresist layer. Thus, patterned source trench dielectric caps 244a and 244b and gate trench dielectric caps 238a, 238b and 238c may have substantially the same thickness (i.e., substantially the same height along the y-direction). In another implementation, patterned source trench dielectric caps 244a and 244b and gate trench dielectric caps 238a, 238b and 238c may be formed separately in different stages of the process flow.

As illustrated in FIG. 2D, patterned source trench dielectric cap 244a is disposed over insulated portion 219a of source trench conductive filler 218a and at least portions of source trench dielectric liner 216a, such that source trench conductive filler 218a is insulated by patterned source trench dielectric cap 244a in insulated portion 219a. Similarly, patterned source trench dielectric cap 244b is disposed over insulated portion 219c of source trench conductive filler 218b and at least portions of source trench dielectric liner 216b, such that source trench conductive filler 218b is insulated by patterned source trench dielectric cap 244b in insulated portion 219c.

Figure 2E:
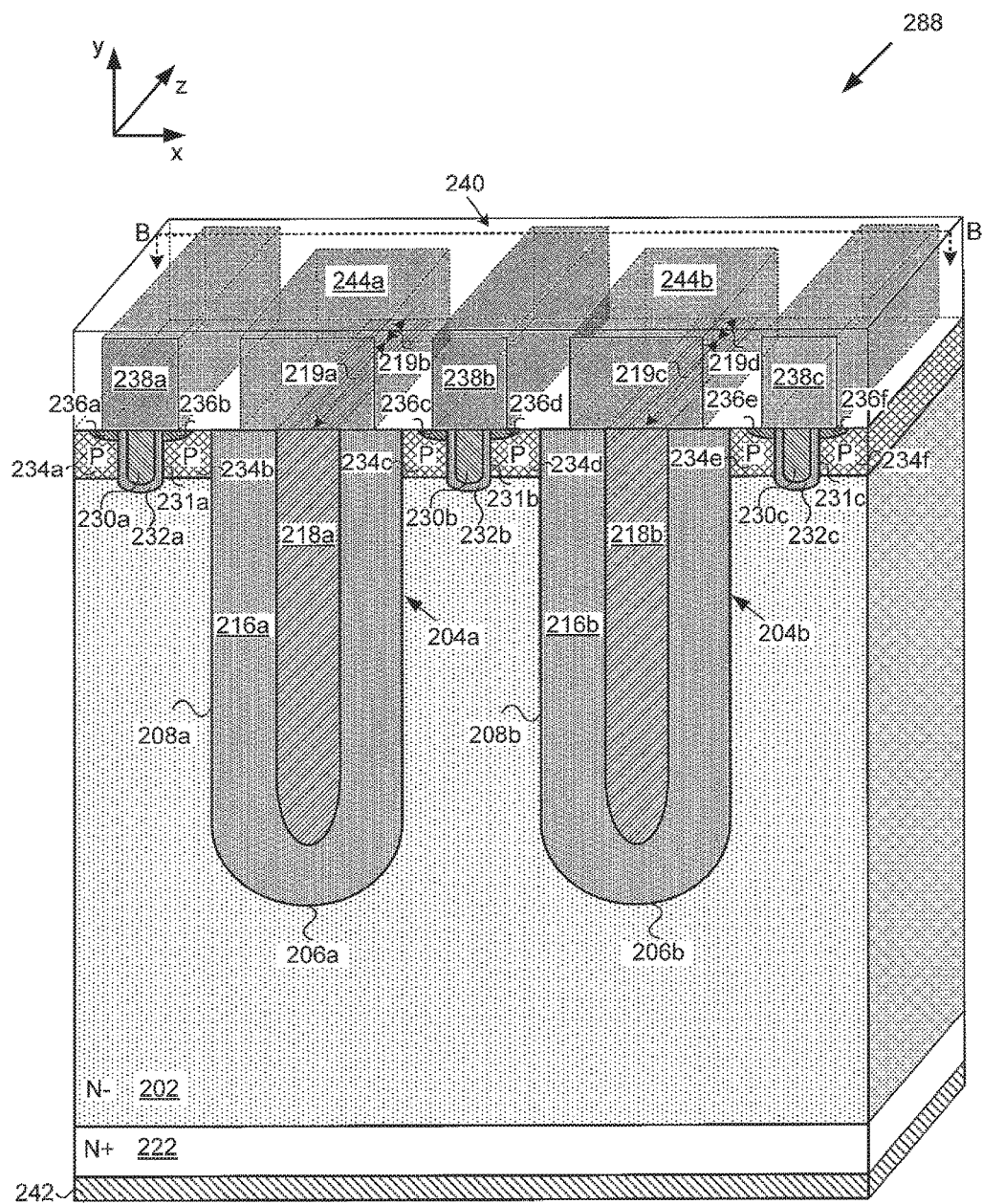
FIG. 2E illustrates a perspective cross-sectional view of a portion of a semiconductor structure processed in accordance with a final action in the flowchart of FIG. 1 according to one implementation of the present application.

Referring to action 188 in FIG. 1 and semiconductor structure 288 in FIG. 2E, action 188 includes forming a source contact layer coupling the source region to the exposed portion of the source trench conductive filler, the insulated portion of the source trench conductive increasing resistance between the source region and the source trench conductive filler. Referring to FIG. 2E, semiconductor structure 288 illustrates a perspective cross-sectional view of a portion of a semiconductor structure after completion of action 188 in flowchart 100 of FIG. 1, according to one implementation of the present disclosure. As illustrated in FIG. 2E, semiconductor structure 288 includes source contact layer 240 formed over semiconductor structure 286 in FIG. 2D. Source contact layer 240 may include any suitable conductive material. As illustrated in FIG. 2E, insulated portion 219a of source trench conductive filler 218a under patterned source trench dielectric cap 244a is electrically insulated from source contact layer 240, while exposed portion 219b of source trench conductive filler 218a is electrically and mechanically coupled to source contact layer 240. Similarly, insulated portion 219c of source trench conductive filler 218b under patterned source trench dielectric cap 244b is electrically insulated from source contact layer 240, while exposed portion 219d of source trench conductive filler 218b is electrically and mechanically coupled to source contact layer 240. Furthermore, gate trench dielectric caps 238a, 238b and 238c are configured to electrically insulate gate trench conductive fillers 230a, 230b and 230c, respectively, from source regions 236a, 236b, 236c, 236d, 236e and 236f and source contact layer 240.

As a result of patterned source trench dielectric cap 244a electrically insulating insulated portion 219a of source trench conductive filler 218a from source contact layer 240, the resistance of insulated portion 219a of source trench conductive filler 218a increases due to the presence of patterned source trench dielectric cap 244a as it opposes the passage of electric current through insulated portion 219a. In other words, insulated portion 219a of source trench conductive filler 218a increases resistance between source contact layer 240 and source trench conductive filler 218a under patterned source trench dielectric cap 244a, as the current needs to flow laterally in the z-direction in insulated portion 219a before getting collected in exposed portion 219b of source trench conductive filler 218a. As such, the increased resistance under patterned source trench dielectric cap 244a is utilized as a snubber resistance integrated in the active region of semiconductor structure 288.

Also, as a result of patterned source trench dielectric cap 244a electrically insulating insulated portion 219a of source trench conductive filler 218a from source contact layer 240, a snubber capacitance is formed across source trench dielectric liner 216a at the bottom of source trench 204a between insulated portion 219a of source trench conductive filler 218a and the semiconductor material below source trench 204a. As such, the snubber capacitance is coupled to the snubber resistance above. Thus, an RC snubber is formed under patterned source trench dielectric cap 244a, where the RC snubber is connected in parallel to exposed portion 219b of source trench conductive filler 218a and the drain-to-source capacitance thereunder.

Similarly, an RC snubber is formed under patterned source trench dielectric cap 244b. For example, as a result of patterned source trench dielectric cap 244b electrically insulating insulated portion 219c of source trench conductive filler 218b from source contact layer 240, the resistance of insulated portion 219c of source trench conductive filler 218b increases due to the presence of patterned source trench dielectric cap 244b as it opposes the passage of electric current through insulated portion 219c. As such, the increased resistance under patterned source trench dielectric cap 244b is utilized as another snubber resistance integrated in the active region of semiconductor structure 288. Also, a snubber capacitance is formed across source trench dielectric liner 216b at the bottom of source trench 204b between insulated portion 219c of source trench conductive filler 218b and semiconductor material below source trench 204b. Thus, another RC snubber is formed under patterned source trench dielectric cap 244b, where the RC snubber is connected in parallel to exposed portion 219d of source trench conductive filler 218b and the drain-to-source capacitance thereunder.

Thus, the RC snubbers under the source trench dielectric caps can suppress the voltage transients, for example, during the switching of semiconductor structure 288, thereby increasing damping of output signals generated by semiconductor structure 288 during electrical operation. Among other advantages, implementations of the present application utilize existing source trenches in the active region of the semiconductor die to form one or more RC snubbers without sacrificing the limited space on the semiconductor die. Moreover, since patterned source trench dielectric caps 244a and 244b and gate trench dielectric caps 238a, 238b and 238c may be formed concurrently, additional processing actions and masks are not required to implement the RC snubbers in the semiconductor structure, thereby saving manufacture cost and time.

It should be noted that, the snubber resistance may depend on the length of the insulated portion of the source trench conductive filler along the z-direction (i.e., the spacing between two adjacent exposed portions of the source trench conductive filler along the z-direction). For example, the longer the insulated portion of the source trench conductive filler under the patterned source trench dielectric cap, the greater snubber resistance the insulated portion of the source trench conductive filler can provide.

Figure 3:
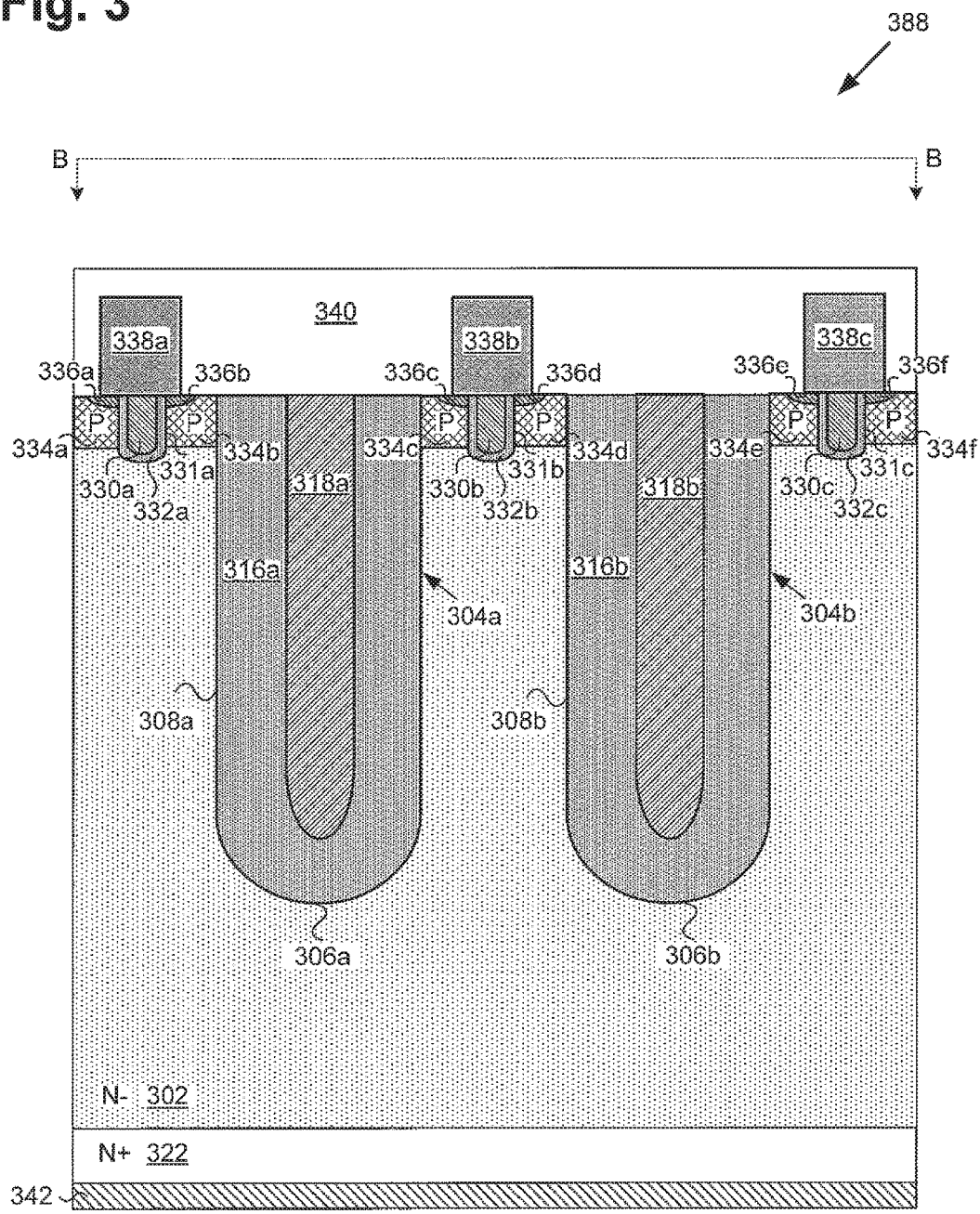
FIG. 3 illustrates a cross-sectional view of a portion of the semiconductor structure along line B-B in FIG. 2E, according to one implementation of the present application.

Referring to FIG. 3, FIG. 3 illustrates a cross-sectional view of a portion of the semiconductor structure in FIG. 2E along line B-B, according to one implementation of the present application. As illustrated in FIG. 3, with similar numerals representing similar features in FIG. 2E, semiconductor structure 388 includes drift region 302 of a first conductivity (e.g., N type), body regions 334a, 334b, 334c, 334d, 334e and 334f (collectively referred to as body region 334) of a second conductivity (e.g., P type) over drift region 302, gate trench conductive fillers 330a, 330b and 330c respectively surrounded by gate trench dielectric liners 332a, 332b and 332c and extending through body region 334 to drift region 302, source regions 336a, 336b, 336c, 336d, 336e and 336f of the first conductivity (e.g., N+ type), and drain region 322 of the first conductivity (e.g., N+ type). In another implementation, drift region 302, drain region 322 and source regions 336a through 336f can have a P type conductivity, and body regions 334a through 334f can have an N type conductivity.

As illustrated in FIG. 3, semiconductor structure 388 includes source trenches 304a and 304b extending through body region 334 to drift region 302, where source trenches 304a and 304b include substantially parallel source trench sidewalls 308a and 308b and bottoms 306a and 306b respectively. Source trenches 304a and 304b include source trench conductive fillers 318a and 318b, respectively, surrounded by source trench dielectric liners 316a and 316b. As illustrated in FIG. 3, semiconductor structure 388 also includes gate trench dielectric caps 338a, 338b and 338c, source contact layer 340, and drain contact layer 342. Gate trench dielectric caps 338a, 338b and 338c are configured to electrically insulate gate trench conductive fillers 330a, 330b and 330c, respectively, from source contact layer 340.

As FIG. 3 is a cross section of semiconductor structure 288 along the line B-B in FIG. 2E, source trench conductive fillers 318a and 318b (e.g., in exposed portions 219b and 219d of source trench conductive fillers 218a and 218b, respectively, in FIG. 2E) are electrically and mechanically coupled to source contact layer 340. The RC snubbers formed under source trench dielectric caps (e.g., in areas under insulated portions 219a and 219c in FIG. 2E) are connected in parallel with conduction channels between source contact layer 340 and drain contact layer 342 (e.g., in areas under exposed portions 219b and 219d in FIG. 2E). As such, the RC snubbers under the source trench dielectric caps are configured to suppress the voltage transients, for example, during the switching of semiconductor structure 388, thereby increasing damping of output signals generated by semiconductor structure 388 during electrical operation.

In the present implementation, source contact layer 340 is formed over gate trench dielectric caps 338a, 338b and 338c in semiconductor structure 388. In another implementation, source contact layer 340 may be coplanar with gate trench dielectric caps 338a, 338b and 338c (and coplanar with patterned source trench dielectric caps 244a and 244b in FIG. 2E), such that the portion of source contact layer 340 over the exposed portion (e.g., exposed portion 219b in FIG. 2E) of source trench conductive filler 318a is isolated from the portion of source contact layer 340 over the exposed portion (e.g., exposed portion 219d in FIG. 2E) of source trench conductive filler 318b by gate trench dielectric cap 338b, for example.

Figure 4:
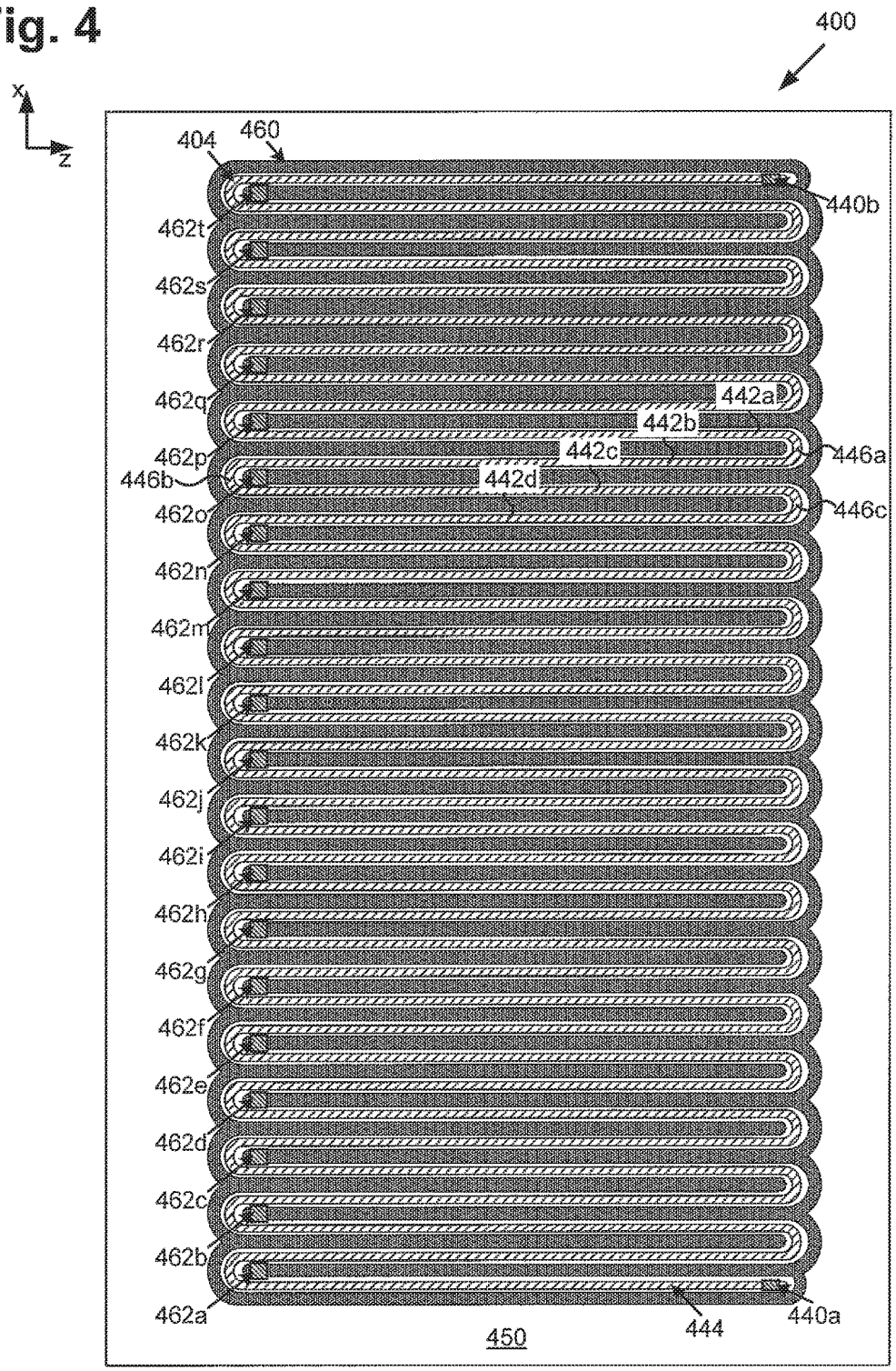
FIG. 4 illustrates a top plan view of a portion of a semiconductor structure according to one implementation of the present application.

Referring to FIG. 4, FIG. 4 illustrates a top plan view of a portion of a semiconductor structure according to one implementation of the present application. As illustrated in FIG. 4, semiconductor structure 400 includes serpentine source trench 404 and termination trench 460 enclosing serpentine source trench 404 on semiconductor die 450. One or more gate trenches (not explicitly shown in FIG. 4) may be disposed between serpentine source trench 404 and termination trench 460. In one implementation, termination trench 460 may include one or more active portions adjacent to the one or more gate trenches as part of an active region, and one or more termination portions around the edges of serpentine source trench 404. In another implementation, termination trench 460 may be a termination trench without any active portions.

As illustrated in FIG. 4, serpentine source trench 404 includes a plurality of parallel portions connected by a plurality of curved portions. For example, serpentine source trench 404 includes parallel portions 442a, 442b, 442c and 442d and curved portions 446a, 446b and 446c, where parallel portions 442a and 442b are connected by curved portion 446a, parallel portions 442b and 442c are connected by curved portion 446b, and parallel portions 442c and 442d are connected by curved portion 446c. In the present implementation, it is important for each adjacent pair of the parallel portions (e.g., parallel portions 442a, 442b, 442c and 442d) and curved portions (e.g., curved portions 446a, 446b and 446c) to have substantially uniform spacing to maintain charge balance to achieve consistent breakdown voltage.

As illustrated in FIG. 4, serpentine source trench 404 includes source contacts 440a and 440b and source trench dielectric cap 444 over a source trench conductive filler (not explicitly shown in FIG. 4). In the present implementation, source contacts 440a and 440b and source trench dielectric cap 444 are substantially coplanar over semiconductor die 450, where source contacts 440a and 440b are electrically and mechanically coupled to the source trench conductive filler in serpentine source trench 404 at both ends. Source trench dielectric cap 444 of serpentine source trench 404 is continuous, along the plurality of parallel portions and curved portions of serpentine source trench 404, over the source trench conductive filler not covered by source contacts 440a and 440b.

As discussed above, the snubber resistance may depend on the length of the insulated portion of the source trench conductive filler along the z-direction (i.e., the spacing between two adjacent exposed portions of the source trench conductive filler along the z-direction). For example, the longer the insulated portion of the source trench conductive filler under the patterned source trench dielectric cap, the greater snubber resistance the insulated portion of the source trench conductive filler can provide. Thus, it may be desirable to maximize the length of the insulated portion of the source trench conductive filler, which may be defined by the distance between two neighboring exposed portions of source trench conductive filler in direct contact with the source contacts.

As illustrated in FIG. 4, serpentine source trench 404 includes source contacts 440a and 440b in direct electrical and mechanical contact with the source trench conductive filler (not explicitly shown in FIG. 4) at each end of serpentine source trench 404. Source trench dielectric cap 444 electrically insulates the source trench conductive filler, which is continuous inside serpentine source trench 404. The insulated portion of the source trench conductive filler under patterned source trench dielectric cap 444 forms a continuous snubber resistance along serpentine source trench 404 between the exposed portions of the source trench conductive filler over which source contacts 440a and 440b reside. As such, the snubber resistance in semiconductor structure 400 is not restricted by the width of semiconductor die 450 (e.g., in the z-direction), but extends continuously along the length of semiconductor die 450 (e.g., in the x-direction).

As further illustrated in FIG. 4, serpentine source trench 404 is enclosed by termination trench 460, which is another source trench in the present implementation. Source contacts 462a, 462b, 462c, 462d, 462e, 462f, 462g, 462h, 462i, 462j, 462k, 462l, 462m, 462n, 462o, 462p, 462q, 462r, 462s and 462t are disposed along one side of semiconductor die 450, and intermittently contact a conductive filler (not explicitly shown in FIG. 4) in termination trench 460 to achieve one or more desired snubber resistances. The spacing between each adjacent pair of source contacts 462a through 462t where the conductive filler inside termination trench 460 is insulated by a respective termination trench dielectric cap (not explicitly shown in FIG. 4). The insulated portions of the conductive filler in termination trench 460 each include a snubber resistance value. In the present implementation, source contacts 462a through 462t are disposed along one side of semiconductor die 450. In another implementation, source contacts 462a through 462t may be disposed at any desired locations (e.g., on both sides of semiconductor die 450) along termination trench 460 to electrically and mechanically couple the conductive filler inside termination trench 460, and achieve desired snubber resistance value.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method of forming a semiconductor structure, the method comprising:
   forming a source trench in a drift region;
   forming a source trench dielectric liner and a source trench conductive filler surrounded by said source trench dielectric liner;
   forming a source region in a body region over said drift region;
   forming a patterned source trench dielectric cap, said patterned source trench dielectric cap forming an insulated portion and an exposed portion of said source trench conductive filler;
   forming a source contact layer coupling said source region to said exposed portion of said source trench conductive filler, said insulated portion of said source trench conductive filler increasing resistance between said source contact layer and said source trench conductive filler under said patterned source trench dielectric cap.

2. The method of claim 1, wherein said insulated portion of said source trench conductive filler is configured to increase damping of output signals generated by said semiconductor structure during electrical operation.

3. The method of claim 1, wherein said insulated portion of said source trench conductive filler and a capacitance under said insulated portion of said source trench conductive filler are configured to increase damping of output signals generated by said semiconductor structure during electrical operation.

4. The method of claim 1, wherein said source trench includes at least two parallel portions and a curved portion connecting said at least two parallel portions.

5. The method of claim 1, wherein said source trench conductive filler includes polysilicon.

6. The method of claim 1, further comprising forming a gate trench adjacent to said source region and extending through said body region into said drift region.

7. The method of claim 6, further comprising forming a gate trench dielectric cap over said gate trench.

8. The method of claim 1, wherein said source trench is a serpentine source trench having a plurality of parallel portions connected by a plurality of curved portions.

9. The method of claim 8, wherein said plurality of parallel portions have substantially uniform spacing.

10. The method of claim 8, wherein said serpentine source trench is enclosed by a termination trench.

11. A method of forming a semiconductor structure, the method comprising:
    forming a drift region over a drain region and a body region over said drift region;
    forming a plurality of source trenches in said drift region;
    forming a source trench dielectric liner and a trench conductive filler in each of said source trenches, said trench conductive filler being surrounded by said source trench dielectric liner;
    forming a source region in said body region between neighboring ones of said source trenches;
    forming a gate trench adjacent to each source region and extending through said body region into said drift region, each gate trench having a gate trench conductive filler surrounded by a gate dielectric liner;
    forming a patterned source trench dielectric cap over a portion of said source trenches so that an exposed portion of said source trench conductive filler in each of said source trenches remains uncovered by said patterned source trench dielectric cap; and
    forming a source contact layer over said patterned source trench dielectric cap and in contact with said exposed portion of said source trench conductive filler in each of said source trenches.

12. The method of claim 11, wherein said drain region includes a highly doped semiconductor substrate.

13. The method of claim 11, wherein said drift region includes epitaxial silicon grown on said drain region.

14. The method of claim 11, wherein forming said plurality of source trenches in said drift region comprises etching said drift region using a patterned photoresist layer.

15. The method of claim 11, wherein said source trenches are parallel portions of a continuous source trench connected by a curved portion of said continuous source trench.

16. The method of claim 11, wherein a first one of said source trenches is a serpentine trench and a second one of said source trenches is a termination trench enclosing said serpentine trench.

17. The method of claim 11, wherein said trench conductive filler comprises polysilicon or amorphous silicon.

18. The method of claim 11, further comprising:
    forming a gate trench dielectric cap over each gate trench and that covers said gate trench conductive filler over an entire length of said gate trench conductive filler.

19. The method of claim 18, wherein said gate trench dielectric cap and said patterned source trench dielectric cap are formed concurrently and have substantially the same thickness.

* * * * *